US008670509B2

United States Patent
Sollenberger et al.

(10) Patent No.: US 8,670,509 B2
(45) Date of Patent: Mar. 11, 2014

(54) ADAPTIVE PATH SELECTION FOR INTERFERENCE CANCELLATION

(75) Inventors: Nelson Sollenberger, St. Thomas, PA (US); Rami Mehio, San Diego, CA (US); Wei Luo, Marlboro, NJ (US); Severine Catreux, Cardiff, CA (US); Sean Truong, San Diego, CA (US); Oghenekome Oteri, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/433,683

(22) Filed: Mar. 29, 2012

(65) Prior Publication Data

US 2013/0142273 A1      Jun. 6, 2013

Related U.S. Application Data

(60) Provisional application No. 61/565,864, filed on Dec. 1, 2011, provisional application No. 61/568,868, filed on Dec. 9, 2011.

(51) Int. Cl.
*H03D 1/04*      (2006.01)

(52) U.S. Cl.
USPC ........... 375/346; 329/320; 375/144; 375/148; 455/278.1

(58) Field of Classification Search
None
See application file for complete search history.

(56) References Cited

U.S. PATENT DOCUMENTS

| 8,179,946 B2 * | 5/2012 | Roberts et al. ................. 375/144 |
| 2011/0064122 A1 * | 3/2011 | Hahm et al. .................. 375/148 |

* cited by examiner

*Primary Examiner* — Adolf Dsouza
(74) *Attorney, Agent, or Firm* — Thomas | Horstemeyer, LLP

(57) ABSTRACT

Adaptive path selection for interference cancellation is provided for wireless communication devices. Signal strength metrics are obtained for each of multiple signal paths. One or more of the signal paths are selected as cancellation candidates in response to determining that the signal paths are associated with a strong interfering path based at least in part on the signal strength metrics for the signal paths and threshold criteria. Cancellation is enabled for an estimated signal generated using the signal paths in response to the signal paths being selected as cancellation candidates.

20 Claims, 10 Drawing Sheets

ADAPTIVE PATH SELECTION FOR INTERFERENCE CANCELLATION

CROSS-REFERENCE TO RELATED APPLICATIONS

This application claims priority to, and the benefit of, U.S. Provisional Patent Application entitled "CELLULAR BASEBAND PROCESSING," having Ser. No. 61/565,864, filed on Dec. 1, 2011, and U.S. Provisional Patent Application entitled "CELLULAR BASEBAND PROCESSING," having Ser. No. 61/568,868, filed on Dec. 9, 2011, both of which are incorporated by reference in their entirety.

BACKGROUND

Wideband code division multiple access (WCDMA) is a third generation (3G) cellular technology that enables the concurrent transmission of a plurality of distinct digital signals via a common RF channel. WCDMA supports a range of communications services that include voice, high speed data and video communications. One such high speed data communications service, which is based on WCDMA technology, is the high speed downlink packet access (HSDPA) service.

WCDMA is a spread spectrum technology in which each digital signal is coded or "spread" across the RF channel bandwidth using a spreading code. Each of the bits in the coded digital signal is referred to as a "chip." A given base transceiver station (BTS), which concurrently transmits a plurality of distinct digital signals, may encode each of a plurality of distinct digital signals by utilizing a different spreading code for each distinct digital signal. At a typical BTS, each of these spreading codes is referred to as a Walsh code. The Walsh coded digital signal may in turn be scrambled by utilizing a pseudo-noise (PN) bit sequence to generate chips. An example of a PN bit sequence is a Gold code. Each of a plurality of BTS within an RF coverage area may utilize a distinct PN bit sequence. Consequently, Walsh codes may be utilized to distinguish distinct digital signals concurrently transmitted from a given BTS via a common RF channel while PN bit sequences may be utilized to distinguish digital signals transmitted by distinct BTSs. The utilization of Walsh codes and PN sequences may increase RF frequency spectrum utilization by allowing a larger number of wireless communications to occur concurrently within a given RF frequency spectrum. Accordingly, a greater number of users may utilize mobile communication devices, such as mobile telephones, Smart phones and/or wireless computing devices, to communicate concurrently via wireless communication networks.

A user utilizing a mobile communication device may be engaged in a communication session with a user utilizing a first mobile communication device via a base transceiver station within a wireless communication network. For example, the mobile communication device may transmit a digital signal to the base transceiver station, which the base transceiver station may then transmit to a second mobile communication device. The base transceiver station may encode signals received from the second mobile communication device and transmitted to the mobile communication device by utilizing a Walsh code and a PN sequence. The second mobile communication device may receive signals transmitted concurrently by multiple base transceiver stations in addition to the base transceiver station within a given RF coverage area. The second mobile communication device may process the received signals by utilizing a descrambling code that is based on the PN sequence and a despreading code that is based on the Walsh code. In doing so, the second mobile communication device may detect a highest relative signal energy level for signals received from base transceiver station, which comprise a digital signal corresponding to the first mobile communication device.

However, the second mobile communication device may also detect signal energy from the digital signals, which correspond to signals from mobile communication devices other than the first mobile communication device. The other signal energy levels from each of these other mobile communication devices may be approximated by Gaussian white noise, but the aggregate noise signal energy level among the other mobile communication device may increase in proportion to the number of other mobile communication devices whose signals are received at the second mobile communication device. This aggregate noise signal energy level may be referred to as multiple access interference (MAI). The MAI may result from signals transmitted by the base transceiver station, which originate from signal received at the base transceiver station from mobile communication devices other than the first mobile communication device. The MAI may also result from signals transmitted by the base transceiver stations BTSs other than the base transceiver station. The MAI and other sources of noise signal energy may interfere with the ability of the second mobile communication device to successfully decode signals received from the first mobile communication device.

An additional source of noise signal energy may result from multipath interference. The digital signal energy corresponding to the second mobile communication device, which is transmitted by the base transceiver station may disperse in a wavefront referred to as a multipath. Each of the components of the multipath may be referred to as a multipath signal. Each of the multipath signals may experience a different signal propagation path from the base transceiver station to the second mobile communication device. Accordingly, different multipath signals may arrive at different time instants at the second mobile communication device. The time duration, which begins at the time instant that the first multipath signal arrives at the second mobile communication device and ends at the time instant that the last multipath signal arrives at the second mobile communication device, is referred to as a delay spread. The second mobile communication device may utilize a rake receiver that allows the second mobile communication device to receive signal energy from a plurality of multipath signals received within a receive window time duration. The receive window time duration may comprise at least a portion of the delay spread time duration. Multipath signals that are not received within the receive window time duration may also contribute to noise signal energy.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the disclosure. Moreover, in the drawings, like reference numerals designate corresponding parts throughout the several views.

DETAILED DESCRIPTION

Figure 1:
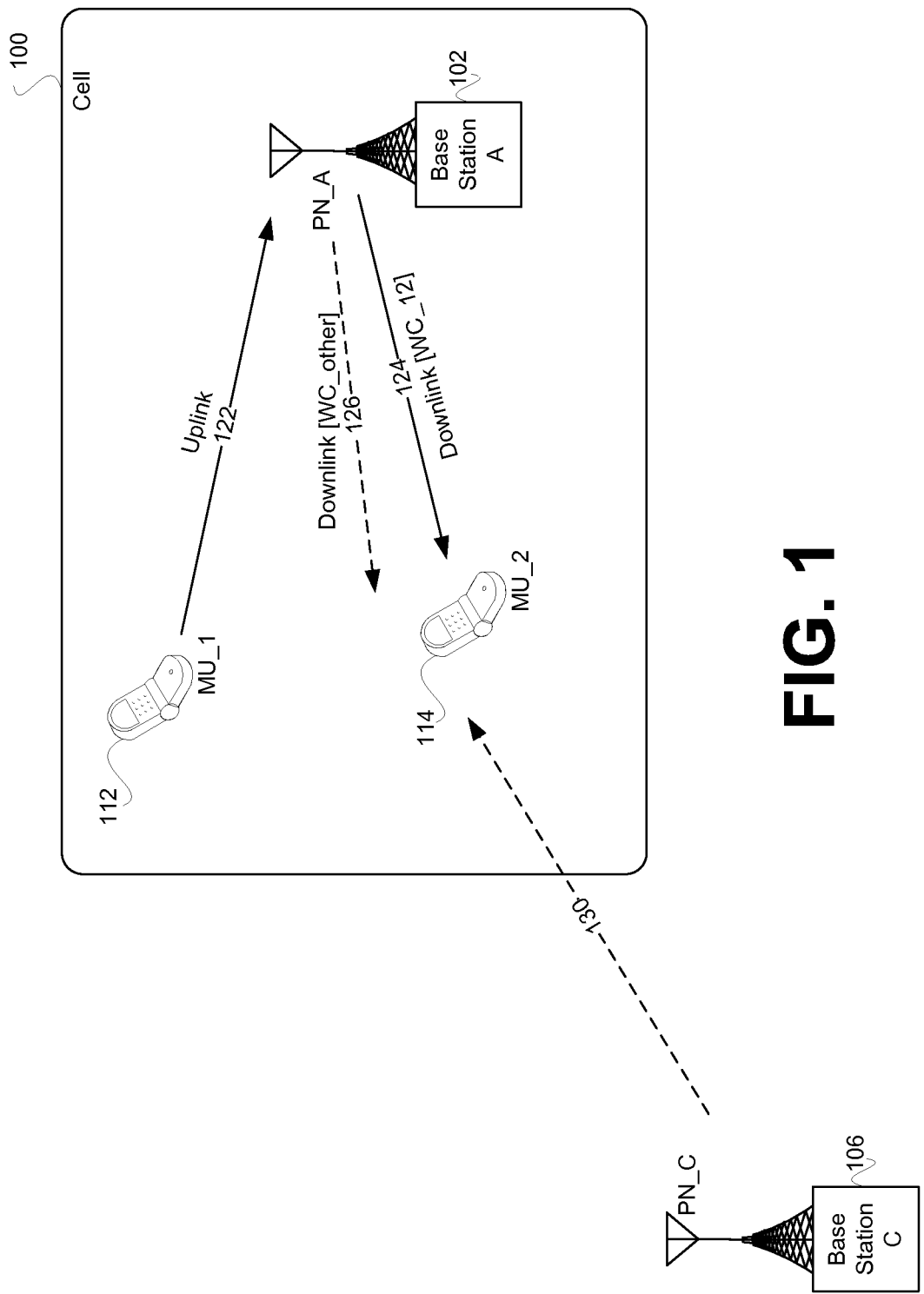
FIG. 1 is a drawing of an exemplary wireless communication system, in accordance with an embodiment of the present disclosure.

The present disclosure relates to adaptive path selection for interference cancellation in a spread-spectrum wireless communication system such as WCDMA and HSDPA. Interference cancellation may be employed to improve the performance of spread-spectrum wireless communication receivers using code division multiple access (CDMA). Interfering signals from other cells using different scrambling codes may be detected and reconstructed. The reconstructed interfering signal may then be subtracted from the desired signal, thereby increasing the quality of the desired signal. Various techniques for such interference cancellation are described in U.S. Patent Application entitled "METHOD AND SYSTEM FOR PROCESSING SIGNALS UTILIZING A PROGRAMMABLE INTERFERENCE SUPPRESSION MODULE," having Ser. No. 12/612,272, and filed on Nov. 4, 2009, which is incorporated by reference herein in its entirety.

The objective of the interference cancellation is to improve the desired signal quality at the receiver. The interference within the received signal may be divided, for example, into two categories: intra-cell interference, where the interference comes from the multipath signals originally transmitted from the desired cell; and inter-cell interference, where the interference comes from multipath signals originally transmitted from cells other than the desired cell. Interference cancellation logic may be configured to carry out both intra-cell and inter-cell interference cancellation. In this scenario, the interference cancellation logic may be used as a standalone block in the receiver or in conjunction, for example, with a rake and/or equalizer. The interference cancellation logic may alternatively be configured to carry out only inter-cell interference cancellation. In this scenario, the interference cancellation logic may be used in conjunction, for example, with either a rake and/or an equalizer, which may be configured to suppress the intra cell interference. In either case, the interference cancellation logic is provided channel estimates by a source such as a rake, cluster path processor, or other source of channel estimates.

In the scenario where the interference cancellation logic is used standalone, the interference cancellation logic reconstructs the desired signal while suppressing the interfering signals and provides a clean signal to a despreader for further processing. In the scenario where the interference cancellation logic is used at the front end of the overall receiver, the interference cancellation logic provides a signal that is clean of inter-cell interference at the input of the rake receiver and/or at the input of the HSDPA receiving chain, which may, for example, contain an equalizer. In both of these scenarios, the block error rate performance and/or HSDPA throughput (i.e., data rate) may be improved for a given signal-to-noise ratio.

Under some conditions, however, if the interference cancellation logic is configured to cancel inter-cell and/or intra-cell interference unconditionally, the interference cancellation may result in a suboptimal performance gain compared to a configuration for conditional interference cancellation. Under such conditions or other conditions where the interference cancellation logic is used with a rake and/or equalizer, the interference cancellation may result in performance degradation rather than gain. In such cases, it may be desirable to operate with either the rake and/or equalizer without the interference cancellation until conditions again become favorable for interference cancellation to be used at the front end. For example, an interfering signal path may be too weak or too noisy to enable accurate reconstruction of the interfering signal within the interference cancellation logic. Cancellation of the reconstructed signal in such a case may adversely impact the desired signal.

Various embodiments of the present disclosure introduce path admission logic to selectively control the interference cancellation. To this end, various gating factors may be employed between the path management and the path cancellation as part of the interference cancellation system. Interfering signal paths that are too weak or too noisy may be left in the signal. The signal paths may be assessed individually (per finger) or jointly (per cell). Additionally, the interference cancellation logic, when used with a rake and/or equalizer, may be disabled or bypassed when it is not being used, which may reduce power consumption.

FIG. 1 is a drawing of an exemplary wireless communication system, in accordance with an embodiment of the present disclosure. Referring to FIG. 1, there is shown a cell 100 and a base station C 106. The cell 100 comprises base station A 102, mobile communication device MU_1 112 and mobile communication device MU_2 114. The base station 106 may be located outside of the cell 100.

The mobile communication devices MU_1 112 and MU_2 114 may be engaged in a communication via the base station A 102. The mobile communication device MU_1 112 may transmit signals to the base station A 102 via an uplink RF channel 122. In response, the base station A 102 may transmit signals to the mobile communication device MU_2 114 via a downlink RF channel 124. Signals transmitted by the base station A 102 may communicate chips that are generated utilizing a scrambling code PN_A. The signals transmitted via RF channel 124 may be spread utilizing a spreading code WC_12. The spreading code WC_12 may comprise an orthogonal variable spreading factor (OVSF) code, for example, a Walsh code, which enables the mobile communication device MU_2 114 to distinguish signals transmitted by the base station A 102 via the downlink RF channel 124 from signals transmitted concurrently by the base station A 102 via other downlink RF channels, for example downlink RF channel 126.

The base station A 102 may utilize one or more OVSF codes, WC_other, when spreading data transmitted via downlink RF channel 126. The one or more OVSF codes, WC_other, may be distinct from the OVSF code WC_12. The base station A 102 may also transmit broadcast signals which may be received by all mobile communication devices. The broadcast signals, spread by OVSF code, WC_broadcast, may be sent simultaneously on downlink RF channels 124 and 126.

The mobile communication device MU_2 114 may receive multiple access interference (MAI) signals from RF channel 126 and/or RF channel 130. As stated above, the signals received via RF channel 126 may be transmitted by the base station A 102. The signals received via RF channel 130 may be transmitted by the base station C 106. The signals transmitted by the base station C 106 may be scrambled based on a scrambling code PN_C.

The mobile communication device MU_2 114 may be operable to perform a soft handoff from the current serving base station A 102 to a base station, which is outside of the cell 100, for example, the base station C 106. Accordingly, the mobile communication device MU_2 114 may be operable to process received signals based on scrambling code PN_C. In this regard, MU_2 114 may listen for signals from base station C 106.

In various embodiments, the mobile communication device MU_2 may comprise suitable logic, circuitry and/or code that are operable to receive signal energy via the RF channels 124, 126, and/or 130, and suppress interference signal energy received via the RF channels 126 and/or 130. The mobile communication device MU_2 may utilize an iterative method for interference cancellation. The iterative method may comprise a weighting iteration, one or more addback, weighting, and un-addback iterations, and an addback iteration.

Although FIG. 1 depicts communication between two mobile devices via a single BTS, the present disclosure is not so limited. For example, aspects of the present disclosure may be equally applicable regardless of the origin of data communicated wirelessly to the mobile communication device 114.

Figure 2:
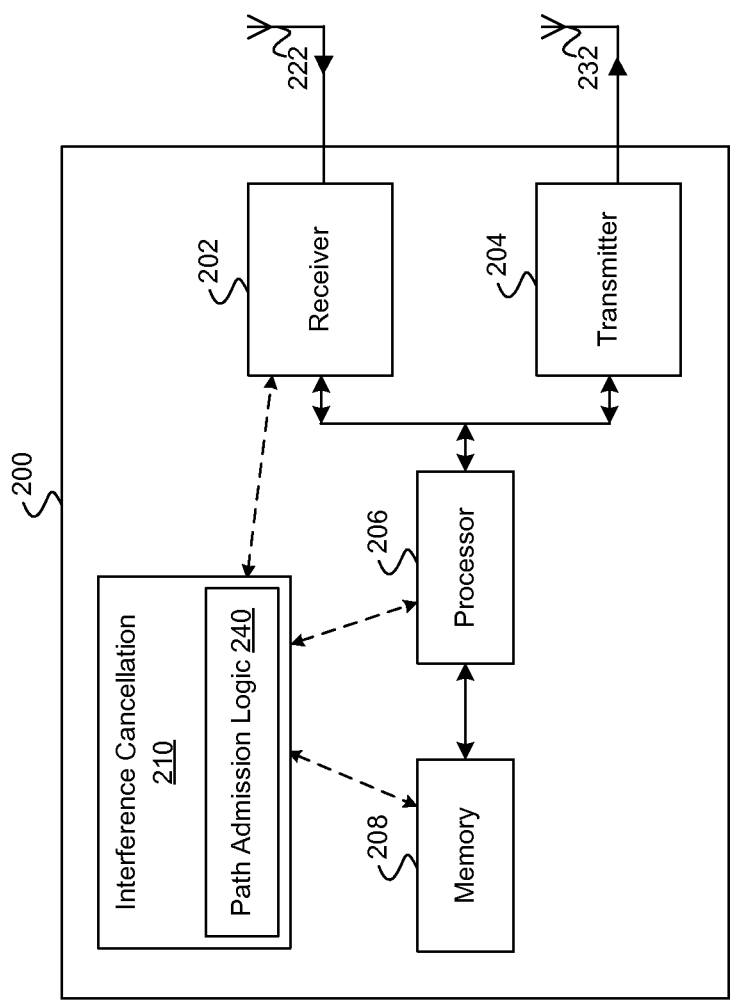
FIG. 2 is a diagram of an exemplary wireless communication device, which may utilize interference suppression, in accordance with various embodiments.

FIG. 2 is a diagram of an exemplary wireless communication device, which may utilize interference suppression, in accordance with various embodiments. Referring to FIG. 2, there is shown a transceiver system 200, a receiving antenna 222 and a transmitting antenna 232. The transceiver system 200 may comprise at least a receiver 202, a transmitter 204, a processor 206, an interference cancellation module 210 and a memory 208. Although a separate receiver 202 and transmitter 204 are illustrated by FIG. 2, the present disclosure is not limited. In this regard, the transmit function and receive function may be integrated into a single transceiver block. The transceiver system 200 may also comprise a plurality of transmitting antennas and/or a plurality of receiving antennas, for example to support diversity transmission and/or diversity reception. Various embodiments may comprise a single antenna, which is coupled to the transmitter 204 and receiver 202 via a transmit and receive (T/R) switch. The T/R switch may selectively couple the single antenna to the receiver 202 or to the transmitter 204 under the control of the processor 206, for example.

The receiver 202 may comprise suitable logic, circuitry, interfaces and/or code that may be operable to perform receive functions that may comprise PHY layer function for the reception or signals. These PHY layer functions may comprise, but are not limited to, the amplification of received RF signals, generation of frequency carrier signals corresponding to selected RF channels, for example uplink or downlink channels, the down-conversion of the amplified RF signals by the generated frequency carrier signals, demodulation of data contained in data symbols based on application of a selected demodulation type, and detection of data contained in the demodulated signals. The RF signals may be received via the receiving antenna 222. The receiver 202 may be operable to process the received RF signals to generate baseband signals. A chip-level baseband signal may comprise a plurality of chips. The chip-level baseband signal may be descrambled based on a PN sequence and despread based on an OVSF code, for example a Walsh code, to generate a symbol-level baseband signal. The symbol-level baseband signal may comprise a plurality of data symbols. The receiver 202 may comprise a rake receiver, which in turn comprises a plurality of rake fingers to process a corresponding plurality of received multipath signals.

The transmitter 204 may comprise suitable logic, circuitry, interfaces and/or code that may be operable to perform transmit functions that may comprise PHY layer function for the transmission or signals. These PHY layer functions may comprise, but are not limited to, modulation of received data to generate data symbols based on application of a selected modulation type, generation of frequency carrier signals corresponding to selected RF channels, for example uplink or downlink channels, the up-conversion of the data symbols by the generated frequency carrier signals, and the generation and amplification of RF signals. The RF signals may be transmitted via the transmitting antenna 232.

The memory 208 may comprise suitable logic, circuitry, interfaces and/or code that may enable storage and/or retrieval of data and/or code. The memory 208 may utilize any of a plurality of storage medium technologies, such as volatile memory, for example random access memory (RAM), and/or non-volatile memory, for example electrically erasable programmable read only memory (EEPROM).

The interference cancellation module 210 may comprise suitable logic, circuitry and/or code that are operable to suppress interference signals, relative to a desired signal, in a received signal. The received signal may comprise one or more desired signals and one or more interference signals. The interference cancellation module 210 may generate interference suppressed versions of the one or more signals in which the signal level for the interference signals is reduced relative to the signal level for the desired signal. The interference cancellation module 210 may include path admission logic 240 which is configured to selectively control cancellation of interfering signal paths.

In operation, the receiver 202 may receive signals via the receiving antenna 222. In an exemplary embodiment, the receiver 202 may comprise a rake receiver. The receiver 202 may communicate signals to the processor 206 and/or to the interference cancellation module 210.

The receiver 202 may generate timing information that corresponds to each of the fingers in the rake receiver portion of the receiver 202. Each of the fingers in the rake receiver may process a distinct one of a plurality of multipath signals that are received within a delay spread time duration. Based on the received RF signals, the receiver 202 may generate chip-level baseband signals. The receiver 202 may communicate the chip-level baseband signals to the interference cancellation module 210. The rake receiver within the receiver 202 may generate one or more symbol-level baseband signals based on a selected one or more OVSF codes and a selected one or more PN sequences. The symbol-level baseband signals may be communicated to the processor 206. The OVSF codes may be selected based on a specified desired user signal. For example, referring to FIG. 1, the rake receiver within receiver 202 associated with mobile communication device MU_2 may select an OVSF code, WC_12, or a broadcast OVSF code, WC_broadcast, and a PN sequence, PN_A, which may be utilized to generate the symbol-level baseband signal from the chip-level baseband signal.

The processor 206 may utilize common pilot channel (CPICH) information, communicated by the signals received from the receiver 202, to compute a plurality of channel estimate values or, in various embodiments, the receiver 202 may compute the channel estimate values. The processor 206 and/or receiver 202 may compute one or more channel estimate values corresponding to each multipath signal, which was transmitted by a given transmit antenna of a given BTS and received at a finger in the rake receiver. The computed channel estimate values may be represented as a channel estimate parameter, H(bts, fgr), where bts represents a numerical index that is associated with a given BTS and fgr is a numerical index that is associated with a given rake finger. The processor 206 may be operable to communicate the computed channel estimate values to the receiver 202 and to the interference cancellation module 210 and/or to the memory 208. The processor 206 may compute and/or select one or more interference cancellation parameter values, which control the signal interference cancellation performance of the interference cancellation module 210. The processor 206 may also be operable to communicate the interference cancellation parameter values to the interference cancellation module 210 and/or to the memory 208.

The processor 206 may also determine which BTSs are associated with a current cell 100 and which BTSs are not associated with the current cell 100. For example, the processor 206 may determine that the base station A 102 and the base station B 104 are associated with the current cell 100, while the base station C 106 is not associated with the current cell 100. In an exemplary embodiment, the processor 206 may store PN sequences for at least a portion of the BTSs that are associated with the current cell 100. For example, referring to FIG. 1, the processor 206 may generate and/or store corresponding PN sequences, for example PN_A and PN_B in the memory 208. The PN sequences may be generated on the fly based on the code structure utilized by the BTS and/or based on timing information associated with the BTS. The PN sequences PN_A and PN_B may be associated with the current cell 100.

In other exemplary embodiments, the processor 206 may generate and/or store PN sequences for at least a portion of the BTSs that are associated with the current cell 100 and at least a portion of the BTSs that are not associated with the current cell 100. For example, referring to FIG. 1, the processor 206 may generate and/or store corresponding PN sequences, for example PN_A, PN_B and PN_C in the memory 208. In general, the processor 206 may store the PN sequences for the BTSs from which a mobile communication device, for example the mobile communication device MC_2 114, may expect to receive signals and the processor 206 may store PN sequences from which the mobile communicating device may not expect to receive signals. The mobile communication device may expect to receive signals, for example common pilot channel (CPICH) signals, from a plurality of BTSs in anticipation of a soft handoff from a current service BTS to a subsequent serving BTS.

In instances in which the transceiver system 200 utilizes a plurality of receiving antennas, for example the receiving antennas 222_1 and 222_2, the transceiver system 200 may utilize receive diversity. In a receive diversity system, the receiver 202 may receive a first set of signals via the receiving antenna 222_1 and a second set of signals via the receiving antenna 222_2. The processor 206 may compute a first set of channel estimate values corresponding to receiving antenna 222_1 and a second set of channel estimate values corresponding to receiving antenna 222_2. The computed channel estimate values may be represented as a channel estimate parameter, H(bts, rx, fgr), where rx represents a numerical index that is associated with a given receiving antenna. In various embodiments, which utilize receive diversity, the receiver 202 and/or the interference cancellation module 210 may also process signals that are transmitted by BTSs, which utilize signal transmission diversity.

The interference cancellation module 210 may receive signals from the receiver 202, which correspond to received multipath signals. The signals received by the interference cancellation module 210 may comprise chip-level baseband signals. A plurality of chips, for example 256 chips, may be associated with a data symbol. The interference cancellation module 210 may be operable to determine a time duration that corresponds to a data symbol processing period. The interference cancellation module 210 may be operable to determine whether to perform iterations of a signal interference suppression on received chip-level baseband signals and/or symbol-level baseband signals, in accordance with an embodiment, during each data symbol processing period. The determination of whether to perform iterations of the signal interference suppression method may be based on, for example, the time instants at which chips, which are associated with a current data symbol and/or subsequent data symbol, arrive at the receiver 202 via received RF signals.

The interference cancellation module 210 may retrieve a plurality of channel estimate values, one or more PN sequences, a plurality of OVSF codes, and one or more interference cancellation parameter values from memory 208. The interference cancellation module 210 may receive timing information from the receiver 202 that corresponds to each of the fingers in the rake receiver portion of the receiver 202.

The interference cancellation module 210 may process received signals, utilizing received timing information and channel estimate values, to combine the multipath signals which are associated with corresponding fingers in the rake receiver. In various embodiments, the interference cancellation module 210 may combine the multipath signals, which were transmitted by a given BTS and associated with a given PN sequence, to generate a combined chip-level signal by utilizing, for example, maximal ratio combining (MRC) and/or equal gain combining (EGC). This combining may be performed on a per-cell basis if the fingers span more than one cell. The interference cancellation module 210 may process the per-cell combined chip-level signal, by utilizing a corresponding PN sequence and OVSF code, to determine a signal level associated with each of the plurality of OVSF codes for each of one or more selected PN sequences. In an exemplary embodiment, the plurality of OVSF codes comprises 256 Walsh codes. Each signal associated with an OVSF code may be referred to as a corresponding user signal although it should be noted that multiple OVSF codes may be associated with a single user and thus there is not necessarily a one-to-one correspondence between OVSF codes and users. For example, a signal associated with a jth OVSF code may be referred to as a jth user signal. Referring to FIG. 1, for example, the OVSF code WC_12 may be associated with a user signal that is transmitted from base station A 102 to the mobile telephone MC_2 114.

The interference cancellation module 210 may compute a signal power level value and a noise power level value corresponding to each of the user signals. Based on the computed signal power level value, noise power level value, and the one or more interference cancellation parameter values, the interference cancellation module 210 may compute a weighting factor value corresponding to each user signal. The plurality of weighting factor values associated with each BTS may be represented as a weighting factor matrix, A(bts), where bts represents a numerical index value that is associated with a given BTS. Each user signal may then be multiplied by the weighting factor before being transferred back into the chip-level domain and subtracted from the original received signal. After subtraction, the signal of interest may be reconstructed for further processing in the rake and/or equalizer receiver.

The interference cancellation module 210 may be operable to process chip-level signals received from each of a plurality of rake fingers in the receiver 202 to generate corresponding interference suppressed chip-level signals based on an iterative method for interference cancellation, in accordance with an embodiment. The interference suppressed chip-level signals may be output to each corresponding rake finger. Each of the rake fingers may then process its respective interference suppressed chip-level signals.

The weighting factor value $z(j)$ is a function of the interference cancellation parameter values $\lambda$ and $\gamma$. In various embodiments, the interference cancellation parameters λ and γ may comprise integer and/or non-integer values. In an exemplary embodiment, λ=1 and γ=1. The processor 206 may be operable to monitor the interference cancellation performance of the interference cancellation module 210, for example by measuring SNR values for processed signals generated by the receiver 202 based on interference suppressed chip-level signals. Accordingly, the processor 206 may be operable to adjust one or both interference cancellation parameter values λ and γ.

Figure 3:
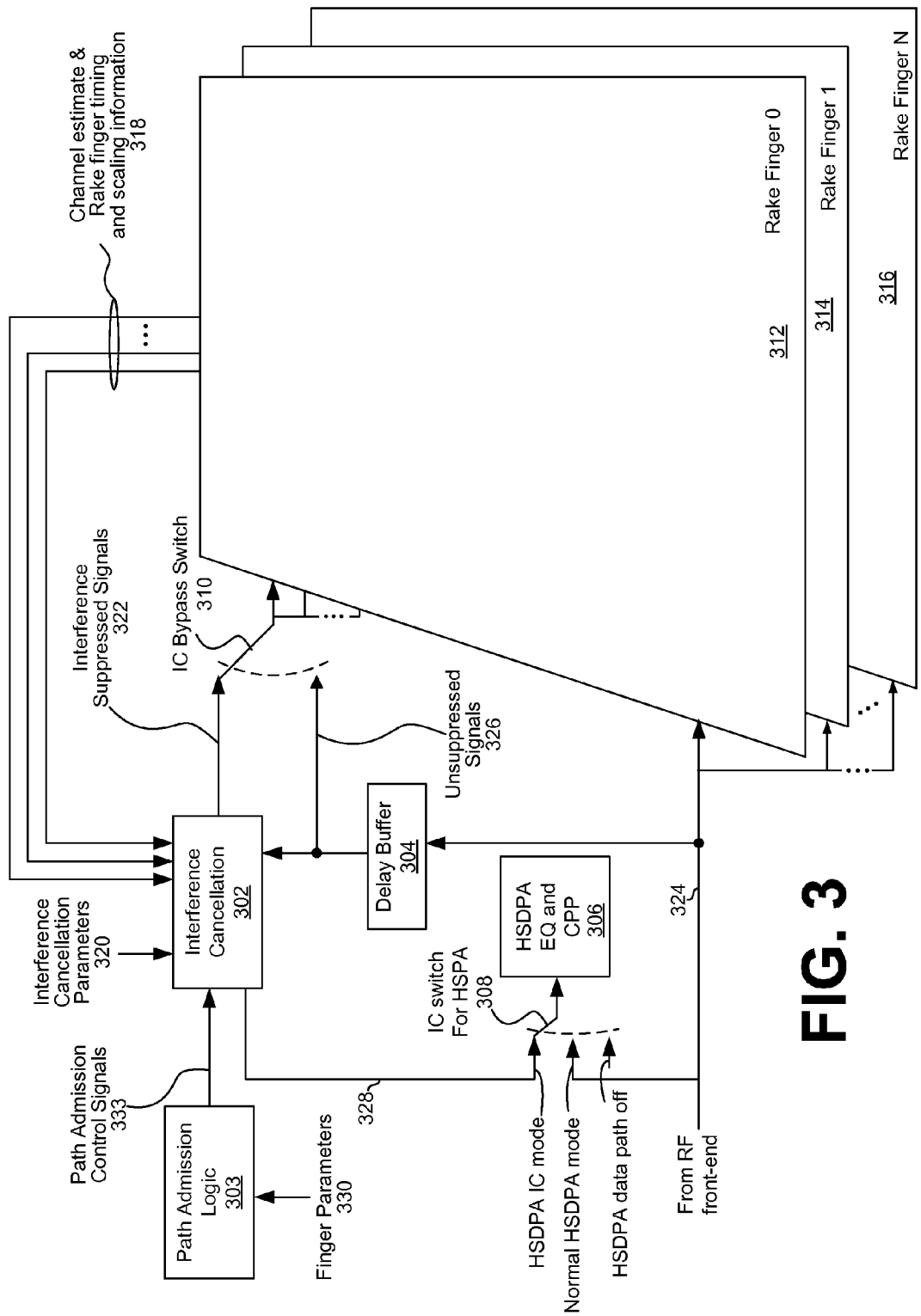
FIG. 3 is a diagram of an exemplary wireless communication receiver with interference suppression, in accordance with an embodiment of the present disclosure.

FIG. 3 is a diagram of an exemplary wireless communication receiver with interference suppression, in accordance with an embodiment of the present disclosure. Referring to FIG. 3, there is shown an interference cancellation module 302, path admission logic 303, a delay buffer 304, a HSDPA processor 306, an HSDPA switching device 308, interference cancellation (IC) bypass switching device 310, and a plurality of rake fingers 312, 314 and 316. The interference cancellation module 302 may correspond to the interference cancellation module 210 as presented in FIG. 2. The rake fingers 312, 314 and 316 represent fingers in a rake receiver. In an exemplary embodiment, the HSDPA switching device 308 and the IC bypass switching device 310 may be configured by the processor 206.

The delay buffer 304 may comprise suitable logic, circuitry, interfaces and/or code that may be operable to receive a burst of a chip-level signal 324 as input at a given input time instant and output it as a burst of a chip-level signal 326 at a subsequent output time instant. The time duration between the input time instant and the output time instant may be referred to as a delay time duration. In an exemplary embodiment, the delay time duration corresponds to 512 chips.

The HSDPA processor 306 may comprise suitable logic, circuitry, interfaces and/or code that may be operable to provide HSDPA processing of received signals.

In operation, the HSDPA switching device 308 may comprise suitable logic, circuitry, interfaces and/or code that are operable to select an input signal to the HSDPA processor 306. As illustrated with respect to FIG. 3, the HSDPA switching device 308 is configured so that it is operable to supply an interference suppressed signal 328, generated by the interference cancellation module 302, as an input to the HSDPA processor 306. As indicated in FIG. 3, this configuration of the HSDPA switching device 308 may result in the HSDPA switching device 308 operating in a HSDPA interference cancellation (IC) mode.

The HSDPA switching device 308 may also be configured so that it is operable to supply the baseband signal 324, generated by the receiver 202, as an input to the HSDPA processor 306. As indicated in FIG. 3, this configuration of the HSDPA switching device 308 may result in the HSDPA switching device 308 operating in a normal HSDPA mode.

The HSDPA switching device 308 may also be configured such that no input signal is supplied to the HSDPA processor 306. As indicated in FIG. 3, this configuration of the HSDPA switching device 308 may result in the HSDPA switching device 308 operating in a HSDPA data path off mode.

The IC bypass switching device 310 may comprise suitable logic, circuitry, interfaces and/or code that are operable to select an input signal to the rake fingers 312, 314 and 316. As illustrated by FIG. 3, the IC bypass switching device 310 is configured so that it is operable to supply an interference suppressed signal 322, generated by the interference cancellation module 302, as an input to the rake fingers 312, 314 and 316.

The IC bypass switching device 310 may also be configured so that it is operable to supply a signal 326, which is output from the delay buffer 304, as an input to the rake fingers 312, 314 and 316. The signal 326 output from the delay buffer 304 may comprise a time-delayed, and possibly up-sampled or down-sampled, version of the signal 324 generated by the receiver 202. As indicated in FIG. 3, the signal 326 output from the delay buffer 304 may comprise unsuppressed interference.

Each of the rake fingers 312, 314 and 316 may receive, as input, the chip-level baseband signal 324 generated by the receiver 202. Based on the input baseband signal 324 from the receiver 202, each rake finger 312, 314 and 316 may generate channel estimates and rake finger timing information. In various embodiments, each rake finger 312, 314 and 316 may generate the channel estimates and/or rake finger timing information for selected multipath signals based on CPICH data received via the input baseband signal 324 received from the receiver 202. In an exemplary embodiment, which comprises a receive diversity system, channel estimates and/or rake finger timing information may be generated for RF signals received at the receiver 202 via at least a portion of a plurality of receiving antennas. Each rake finger 312, 314 and 316 may communicate, as one or more signals 318, its respective channel estimates, rake finger timing information, scaling factors Kfgr, scrambling codes associated with one or more BTSs, and/or other information to the interference cancellation module 302.

In various embodiments, the interference cancellation module 302 may receive chip-level signals 326 from the delay buffer 304. Based on the channel estimates, rake finger timing, and/or other information communicated via the signal(s) 318, the interference cancellation module 302 may select individual multipath signals from the chip-level signals 326 received via the delay buffer 304. Based on the interference cancellation parameters 320, which may be as described with respect to FIG. 2, the interference cancellation module 302 may process the received chip-level multipath signal 326 utilizing an iterative method for interference cancellation, in accordance with an embodiment.

The chip-level signals 326 received from the delay buffer 304 may comprise a plurality of multipath signals received via one or more receive antennas from one or more transmit antennas of one or more BTSs. The interference cancellation module 302 may be configurable to assign signal processing resources to perform the iterative method of interference cancellation for selected multipath signals. The processor 206 may configure the interference cancellation module 302 to receive multipath signals from one or more transmit antennas of one or more BTSs. In an exemplary embodiment, which comprises a receive diversity system, the selected multipath signals may be received via one or more of a plurality of receiving antennas. The processor 206 may configure the interference cancellation module 302 for receive diversity.

The interference cancellation module 302 may receive interference cancellation parameters 320 from the processor 206 and/or from the memory 208. In an exemplary embodiment, the interference cancellation module 302 may generate and/or retrieve PN sequences and/or OVSF codes from the memory 208. The PN sequences may be generated on the fly based on the code structure utilized by the BTS and/or based on timing information associated with the BTS. The interference cancellation module 302 may retrieve and/or generate a PN sequence for each of the one or more transmit antennas of the one or more BTSs from which the interference cancellation module 302 is configured to attempt to receive a signal.

In various embodiments in which the receiver 202 utilizes a plurality of receiving antennas and/or receives data from a plurality of transmit antennas, data received via the symbol-level signals corresponding to the plurality of receiving antennas and/or transmit antennas may be decoded by utilizing various diversity decoding methods. Various embodiments may also be practiced when the receiver 202 is utilized in a multiple input multiple output (MIMO) communication system. In instances where the receiver 202 is utilized in a MIMO communication system, data received via the symbol-level signals, received via the plurality of receiving antennas, may be decoded by utilizing various MIMO decoding and/or diversity decoding methods.

The path admission logic 303 obtains a plurality of finger parameters 330 corresponding to each of the fingers from the rake receiver 202 and generates path admission control signals 333 to control the interference cancellation module 302, thereby enabling or disabling interference cancellation on a per-finger basis. The finger parameters 330 include a measure of finger strength for each of the fingers. For example, the measure of finger strength may be provided in energy per chip over total received power (Ec/Io). Here, the energy per chip may refer to the energy with respect to the CPICH channel. The operation of the path admission logic 303 will be described in further detail with respect to the following flowcharts.

Figure 4:
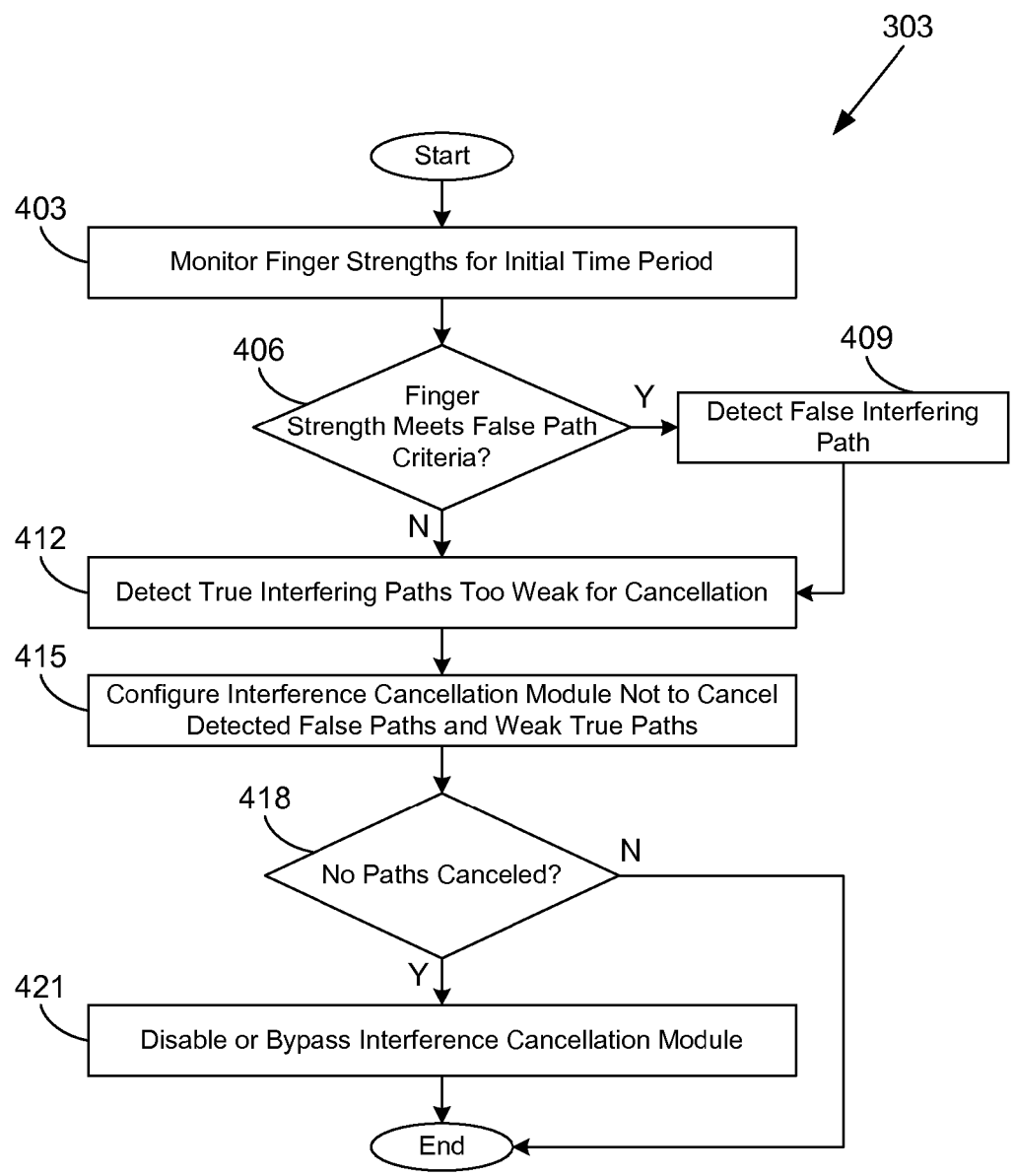
FIGS. 4-9 are flowcharts illustrating examples of functionality implemented as portions of path admission logic in the exemplary wireless communication receiver of FIG. 3 according to various embodiments of the present disclosure.

Referring next to FIG. 4, shown is a flowchart that provides one example of the operation of the path admission logic 303 according to various embodiments. It is understood that the flowchart of FIG. 4 provides merely an example of the many different types of functional arrangements that may be employed to implement the operation of the path admission logic 303 as described herein. As an alternative, the flowchart of FIG. 4 may be viewed as depicting an example of steps of a method implemented in the path admission logic 303 according to one or more embodiments.

Beginning with box 403, the path admission logic 303 monitors the signal strengths of the fingers for an initial time period following finger assignment. In box 406, the path admission logic 303 determines whether the finger strength meets a threshold criterion for being considered a false path. For example, if the finger strength measured over the predefined time period never exceeds a minimum threshold for being considered a true interfering path, the path associated with the finger may be deemed a false interfering path. If any of the finger strengths meet the false path criteria, the path admission logic 303 detects the false interfering paths in box 409 for the corresponding fingers. The fingers corresponding to the false interfering paths will not be cancellation candidates. The initial time period utilized for false path detection also enables a warm-up period for channel estimation.

In box 412, the path admission logic 303 detects true interfering paths which are too weak for cancellation. The strength of each assigned finger is monitored to fulfill certain threshold criteria before the path associated with the finger can be a cancellation candidate. Various embodiments for detecting weak interfering paths are further described in connection with the flowcharts of FIGS. 5-9. In the several embodiments, values for various thresholds may be empirically determined. In box 415, the path admission logic 303 configures the interference cancellation module 302 (FIG. 3) not to cancel the detected false paths and not to cancel the detected weak true paths.

In box 418, the path admission logic 303 determines whether no paths are canceled by the interference cancellation module 302. If no paths are canceled, the path admission logic 303 disables the interference cancellation module 302 in box 421. This may involve placing the interference cancellation module 302 into a bypass mode, e.g., by activating the bypass switch 310 (FIG. 3). The criteria discussed above for weak interfering paths and false paths may be checked at a desired rate. Thus, cancellation by the interference cancellation module 302 may be adapted at this rate, e.g., the 10 ms frame rate or another rate.

Figure 5:
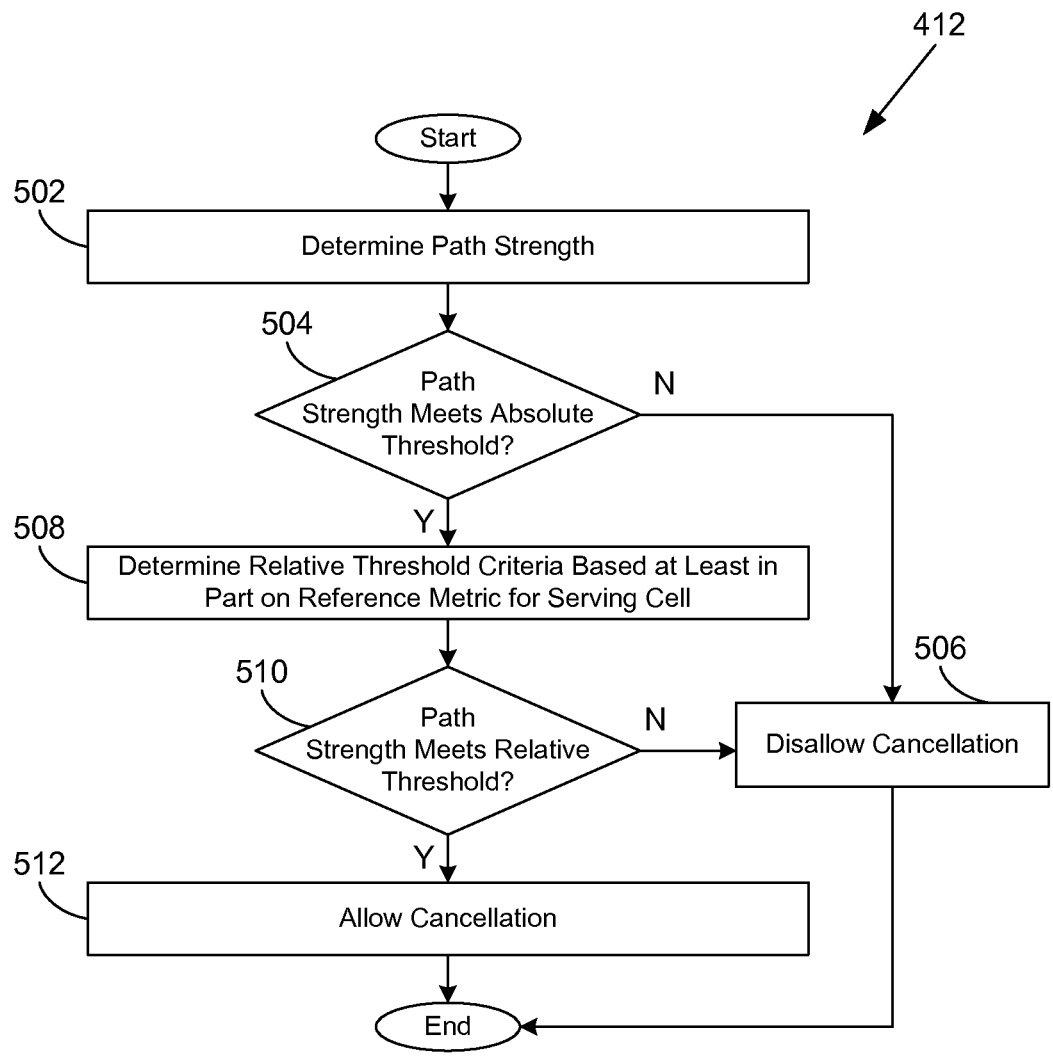

Moving on to FIG. 5, shown is a flowchart that provides one example of the operation of a portion of the path admission logic 303 (FIG. 3) according to a first embodiment. In particular, FIG. 5 relates to box 412 of FIG. 4, which involves detecting true interfering paths which are too weak for cancellation. FIG. 5 pertains to enabling cancellation on a per-finger basis. It is understood that the flowchart of FIG. 5 provides merely an example of the many different types of functional arrangements that may be employed to implement the operation of the portion of the path admission logic 303 as described herein. As an alternative, the flowchart of FIG. 5 may be viewed as depicting an example of steps of a method implemented in the path admission logic 303 according to a first embodiment.

Beginning with box 502, the path admission logic 303 determines the path signal strength (e.g., in Ec/Io or some other measure). In box 504, the path admission logic 303 determines whether the path strength meets some absolute threshold (e.g., the path Ec/Io is at least Y dB, where Y is a threshold value). If the path strength does not meet the absolute threshold criteria, the path admission logic 303 moves to box 506 and disallows cancellation of the path. Thereafter, the portion of the path admission logic 303 ends.

If the path strength does meet the absolute threshold criteria, the path admission logic 303 moves from box 504 to box 508 and determines relative threshold criteria based at least in part on a reference signal strength metric for the serving cell. The reference signal strength metric may correspond, for example, to the signal strength (e.g., in Ec/Io or some other measure) for the strongest path of the serving cell (i.e., the desired signal), the total sum of signal strengths for all paths of the serving cell, the sum of signal strengths for a subset of strongest paths for the serving cell, and so on. In box 510, the path admission logic 303 determines whether the path strength for the current finger meets relative threshold criteria. For example, the relative threshold criteria may be that the path Ec/Io is within X dB of the Ec/Io of the strongest path of the serving cell, where X is a threshold value. X may be selected such that X is much larger than Y. As a non-limiting example, X may be −5 dB, and Y may be −20 dB.

If the path strength does not meet the relative threshold criteria, the path admission logic 303 moves to box 506 and disallows cancellation of the path. Thereafter, the portion of the path admission logic 303 ends. If the path strength does meet the relative threshold criteria, the path admission logic 303 instead moves from box 510 to box 512 and allows cancellation of the path. Thereafter, the portion of the path admission logic 303 ends. The portion of the path admission logic 303 depicted in FIG. 5 may be repeated for each candidate finger or path.

Figure 6A:
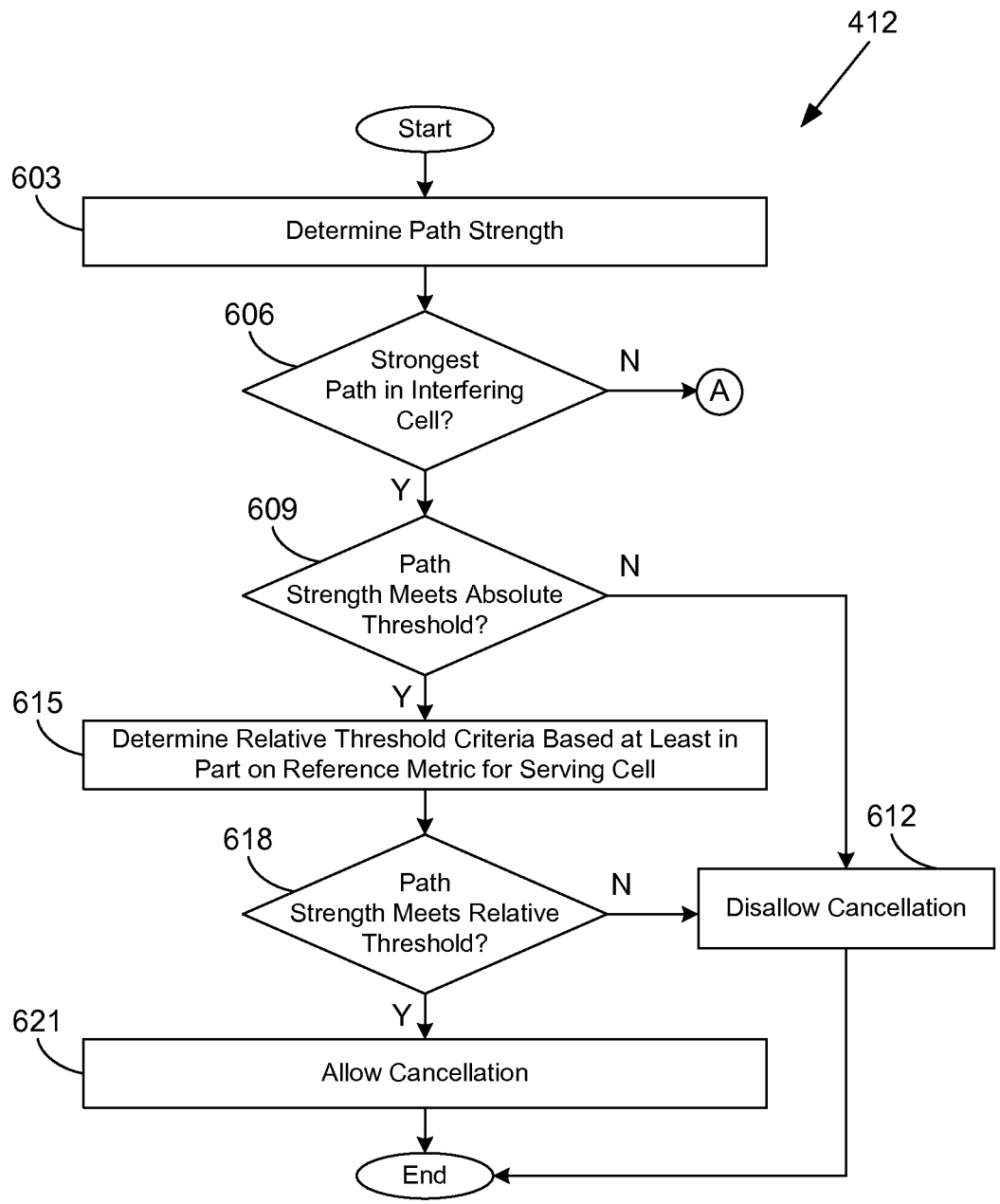
Figure 6B:
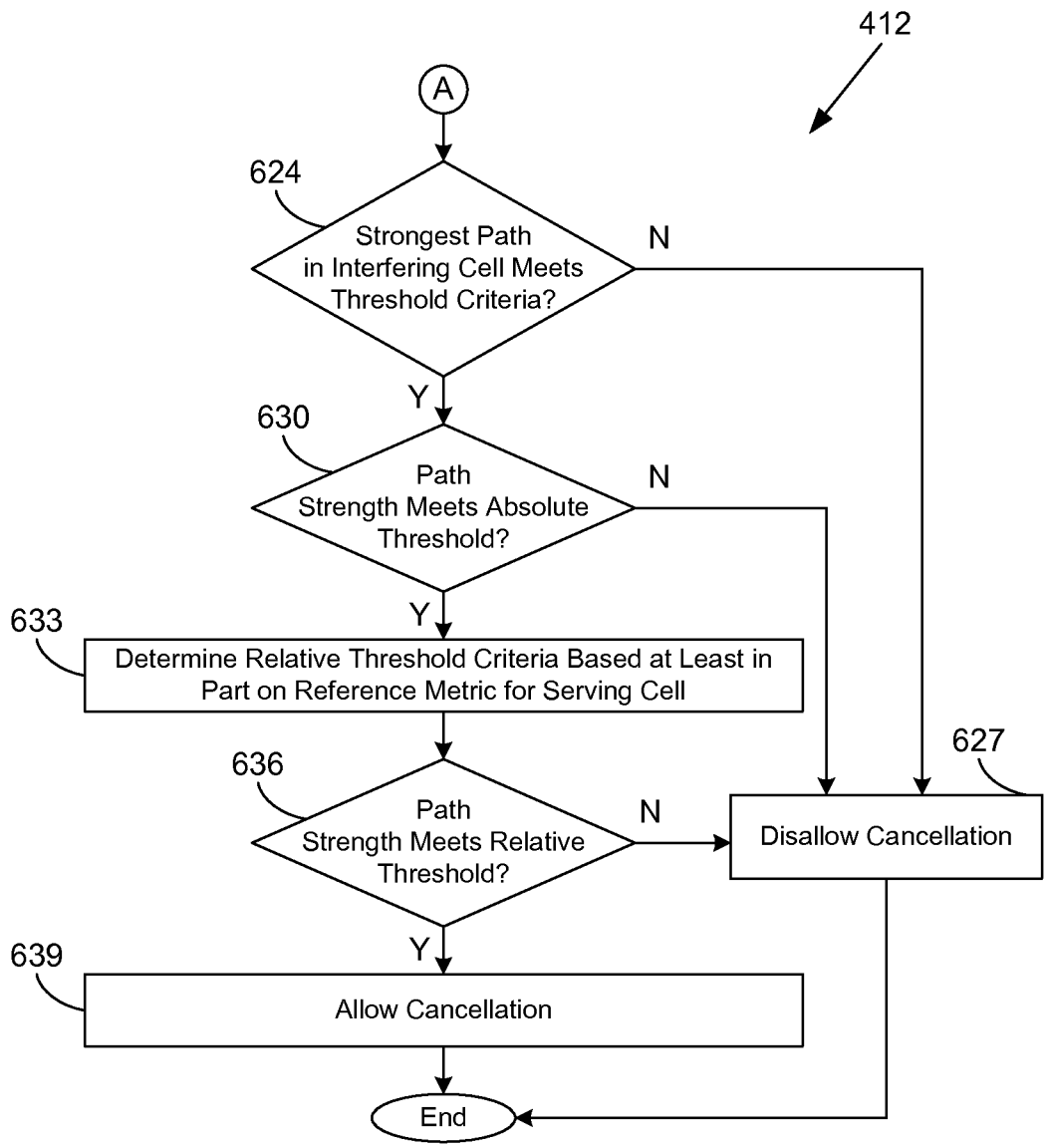

Turning now to FIGS. 6A and 6B, shown is a flowchart that provides one example of the operation of a portion of the path admission logic 303 (FIG. 3) according to a second embodiment. In particular, FIGS. 6A and 6B relate to box 412 of FIG. 4, which involves detecting true interfering paths which are too weak for cancellation. FIGS. 6A and 6B relate to a conservative per-cell cancellation which may be enabled on a per-finger basis. It is understood that the flowchart of FIGS. 6A and 6B provide merely an example of the many different types of functional arrangements that may be employed to implement the operation of the portion of the path admission logic 303 as described herein. As an alternative, the flowchart of FIGS. 6A and 6B may be viewed as depicting an example of steps of a method implemented in the path admission logic 303 according to a second embodiment.

Beginning with box 603 in FIG. 6A, the path admission logic 303 determines the path signal strength (e.g., in Ec/Io or some other measure). In box 606, the path admission logic 303 determines whether the path corresponds to a strongest path in an interfering cell (i.e., not the serving cell). If the path corresponds to the strongest path in the interfering cell, the path admission logic 303 transitions from box 606 to box 609. In box 609, the path admission logic 303 determines whether the path strength meets some absolute threshold (e.g., the path Ec/Io is at least Z dB, where Z is a threshold value). If the path strength does not meet the absolute threshold criteria, the path admission logic 303 moves to box 612 and disallows cancellation of the path and the other paths in the interfering cell. Thereafter, the portion of the path admission logic 303 ends.

If the path strength does meet the absolute threshold criteria, the path admission logic 303 moves from box 609 to box 615 and determines relative threshold criteria based at least in part on a reference signal strength metric for the serving cell. The reference signal strength metric may correspond, for example, to the signal strength (e.g., in Ec/Io or some other measure) for the strongest path of the serving cell (i.e., the desired signal), the total sum of signal strengths for all paths of the serving cell, the sum of signal strengths for a subset of strongest paths for the serving cell, and so on. In box 618, the path admission logic 303 determines whether the path strength for the current finger meets relative threshold criteria. For example, the relative threshold criteria may be that the path Ec/Io is within X dB of the Ec/Io of the strongest path of the serving cell, where X is a threshold value. X may be selected such that X is much larger than Z. As a non-limiting example, X may be −5 dB, and Z may be −20 dB.

If the path strength does not meet the relative threshold criteria, the path admission logic 303 moves to box 612 and disallows cancellation of the path and the other paths in the cell. Thereafter, the portion of the path admission logic 303 ends. If the path strength does meet the relative threshold criteria, the path admission logic 303 instead moves from box 618 to box 621 and allows cancellation of the path. Thereafter, the portion of the path admission logic 303 ends.

If the path is determined not to be the strongest path in an interfering cell in box 606, the path admission logic 303 instead moves from box 606 to box 624 in FIG. 6B. In box 624, the path admission logic 303 determines whether the strongest path in the interfering cell meets the absolute and relative threshold criteria. If the strongest path does not meet the criteria, the path admission logic 303 continues to box 627 and disallows cancellation of the path. Thereafter, the portion of the path admission logic 303 ends.

If the strongest path does meet the criteria, the path admission logic 303 moves from box 624 to box 630. In box 630, the path admission logic 303 determines whether the path strength meets some absolute threshold (e.g., the path Ec/Io is at least Z1 dB, where Z1 is a threshold value). If the path strength does not meet the absolute threshold criteria, the path admission logic 303 moves to box 627 and disallows cancellation of the path. Thereafter, the portion of the path admission logic 303 ends.

If the path strength does meet the absolute threshold criteria, the path admission logic 303 moves from box 630 to box 633 and determines relative threshold criteria based at least in part on a reference signal strength metric for the serving cell. The reference signal strength metric may correspond, for example, to the signal strength (e.g., in Ec/Io or some other measure) for the strongest path of the serving cell (i.e., the desired signal), the total sum of signal strengths for all paths of the serving cell, the sum of signal strengths for a subset of strongest paths for the serving cell, and so on. In box 636, the path admission logic 303 determines whether the path strength for the current finger meets relative threshold criteria. For example, the relative threshold criteria may be that the path Ec/Io is within Y dB of the Ec/Io of the strongest path of the serving cell, where Y is a threshold value. Y may be selected such that Y is much larger than Z1. As a non-limiting example, Y may be −10 dB, and Z1 may be −25 dB. Also, Y may be selected to be less than X (e.g., X=−5 dB, while Y=−10 dB), and Z1 may be selected to be less than or equal to Z (e.g., Z=−20 dB, while Z1=−25 dB).

If the path strength does not meet the relative threshold criteria, the path admission logic 303 moves to box 627 and disallows cancellation of the path. Thereafter, the portion of the path admission logic 303 ends. If the path strength does meet the relative threshold criteria, the path admission logic 303 instead moves from box 636 to box 639 and allows cancellation of the path. Thereafter, the portion of the path admission logic 303 ends. The portion of the path admission logic 303 depicted in FIGS. 6A and 6B may be repeated for each candidate finger or path.

Figure 7:
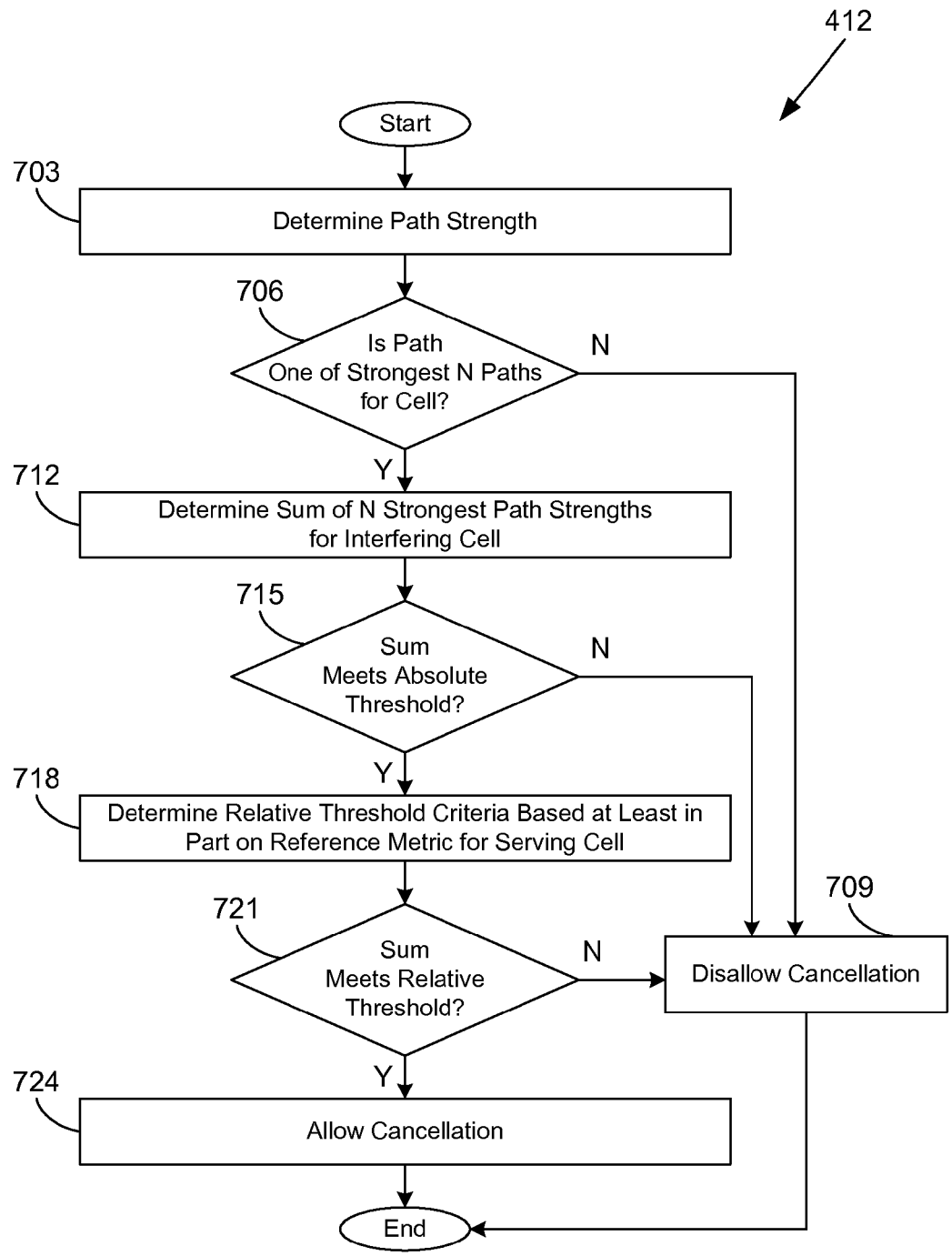

Continuing on to FIG. 7, shown is a flowchart that provides one example of the operation of a portion of the path admission logic 303 (FIG. 3) according to a third embodiment. In particular, FIG. 7 relates to box 412 of FIG. 4, which involves detecting true interfering paths which are too weak for cancellation. FIG. 7 relates to an aggressive per-cell cancellation which may be enabled on a per-finger basis. It is understood that the flowchart of FIG. 7 provides merely an example of the many different types of functional arrangements that may be employed to implement the operation of the portion of the path admission logic 303 as described herein. As an alternative, the flowchart of FIG. 7 may be viewed as depicting an example of steps of a method implemented in the path admission logic 303 according to a third embodiment.

Beginning with box 703, the path admission logic 303 determines the path signal strength (e.g., in Ec/Io or some other measure). In box 706, the path admission logic 303 determines whether the path is one of the strongest N paths for the interfering cell. In other words, the path admission logic 303 determines whether the path is a member of a subset of the paths for the interfering cell containing the N strongest paths. If the path is not one of the strongest N paths for the interfering cell, the path admission logic 303 moves to box 709 and disallows cancellation of the path. Thereafter, the portion of the path admission logic 303 ends.

If the path is one of the strongest N paths for the interfering cell, the path admission logic 303 moves from box 706 to box 712 and determines a sum of the signal strength metrics (e.g., Ec/Io, etc.) for the N strongest paths of the interfering cell. In box 715, the path admission logic 303 determines whether this sum of path strengths meets some absolute threshold (e.g., the Ec/Io is at least Y dB, where Y is a threshold value). If the sum does not meet the absolute threshold criteria, the path admission logic 303 moves to box 709 and disallows cancellation of the path. Thereafter, the portion of the path admission logic 303 ends.

If the sum of path strengths does meet the absolute threshold criteria, the path admission logic 303 moves from box 715 to box 718 and determines relative threshold criteria based at least in part on a reference signal strength metric for the serving cell. The reference signal strength metric may correspond, for example, to the signal strength (e.g., in Ec/Io or some other measure) for the strongest path of the serving cell (i.e., the desired signal), the total sum of signal strengths for all paths of the serving cell, the sum of signal strengths for a subset of strongest paths for the serving cell, and so on. In box 721, the path admission logic 303 determines whether the sum of the strongest N path strengths for the interfering cell meets relative threshold criteria. For example, the relative threshold criteria may be that the sum Ec/Io is within X dB of the Ec/Io of the strongest path of the serving cell, where X is a threshold value. X may be selected such that X is much larger than Y. As a non-limiting example, X may be −5 dB, and Y may be −20 dB.

If the sum of path strengths does not meet the relative threshold criteria, the path admission logic 303 moves to box 709 and disallows cancellation of the path. Thereafter, the portion of the path admission logic 303 ends. If the sum does meet the relative threshold criteria, the path admission logic 303 instead moves from box 721 to box 724 and allows cancellation of the path. Thereafter, the portion of the path admission logic 303 ends. The portion of the path admission logic 303 depicted in FIG. 7 may be repeated for each candidate finger or path.

Figure 8:
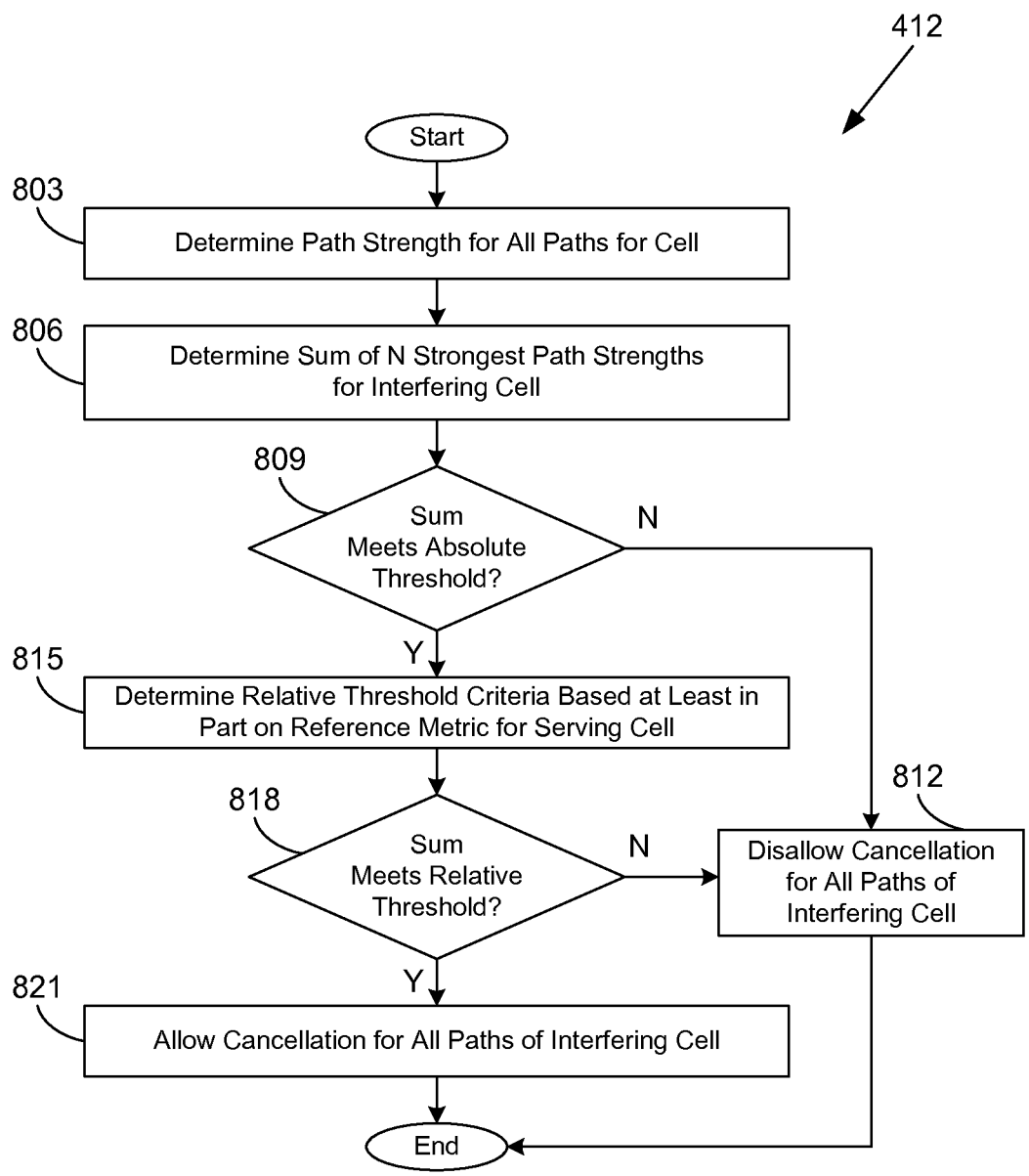

Referring next to FIG. 8, shown is a flowchart that provides one example of the operation of a portion of the path admission logic 303 (FIG. 3) according to a fourth embodiment. In particular, FIG. 8 relates to box 412 of FIG. 4, which involves detecting true interfering paths which are too weak for cancellation. FIG. 8 relates to per-cell cancellation that is enabled on per-cell basis. It is understood that the flowchart of FIG. 8 provides merely an example of the many different types of functional arrangements that may be employed to implement the operation of the portion of the path admission logic 303 as described herein. As an alternative, the flowchart of FIG. 8 may be viewed as depicting an example of steps of a method implemented in the path admission logic 303 according to a fourth embodiment.

Beginning with box 803, the path admission logic 303 determines the path signal strength (e.g., in Ec/Io or some other measure) for all paths of an interfering cell. In box 806, the path admission logic 303 determines a sum of the signal strength metrics (e.g., Ec/Io, etc.) for the N strongest paths of the interfering cell. In box 809, the path admission logic 303 determines whether this sum of path strengths meets some absolute threshold (e.g., the Ec/Io is at least Y dB, where Y is a threshold value). If the sum does not meet the absolute threshold criteria, the path admission logic 303 moves to box 812 and disallows cancellation for all paths of the interfering cell. Thereafter, the portion of the path admission logic 303 ends.

If the sum of path strengths does meet the absolute threshold criteria, the path admission logic 303 moves from box 809 to box 815 and determines relative threshold criteria based at least in part on a reference signal strength metric for the serving cell. The reference signal strength metric may correspond, for example, to the signal strength (e.g., in Ec/Io or some other measure) for the strongest path of the serving cell (i.e., the desired signal), the total sum of signal strengths for all paths of the serving cell, the sum of signal strengths for a subset of strongest paths for the serving cell, and so on. In box 818, the path admission logic 303 determines whether the sum of the strongest N path strengths for the interfering cell meets relative threshold criteria. For example, the relative threshold criteria may be that the sum Ec/Io is within X dB of the Ec/Io of the strongest path of the serving cell, where X is a threshold value. X may be selected such that X is much larger than Y. As a non-limiting example, X may be −5 dB, and Y may be −20 dB.

If the sum of path strengths does not meet the relative threshold criteria, the path admission logic 303 moves to box 812 and disallows cancellation of the path. Thereafter, the portion of the path admission logic 303 ends. If the sum does meet the relative threshold criteria, the path admission logic 303 instead moves from box 818 to box 821 and allows cancellation for all paths of the interfering cell. Thereafter, the portion of the path admission logic 303 ends. The variable N may be incremented until it is equal to the number of paths associated with the interfering cell.

Figure 9:
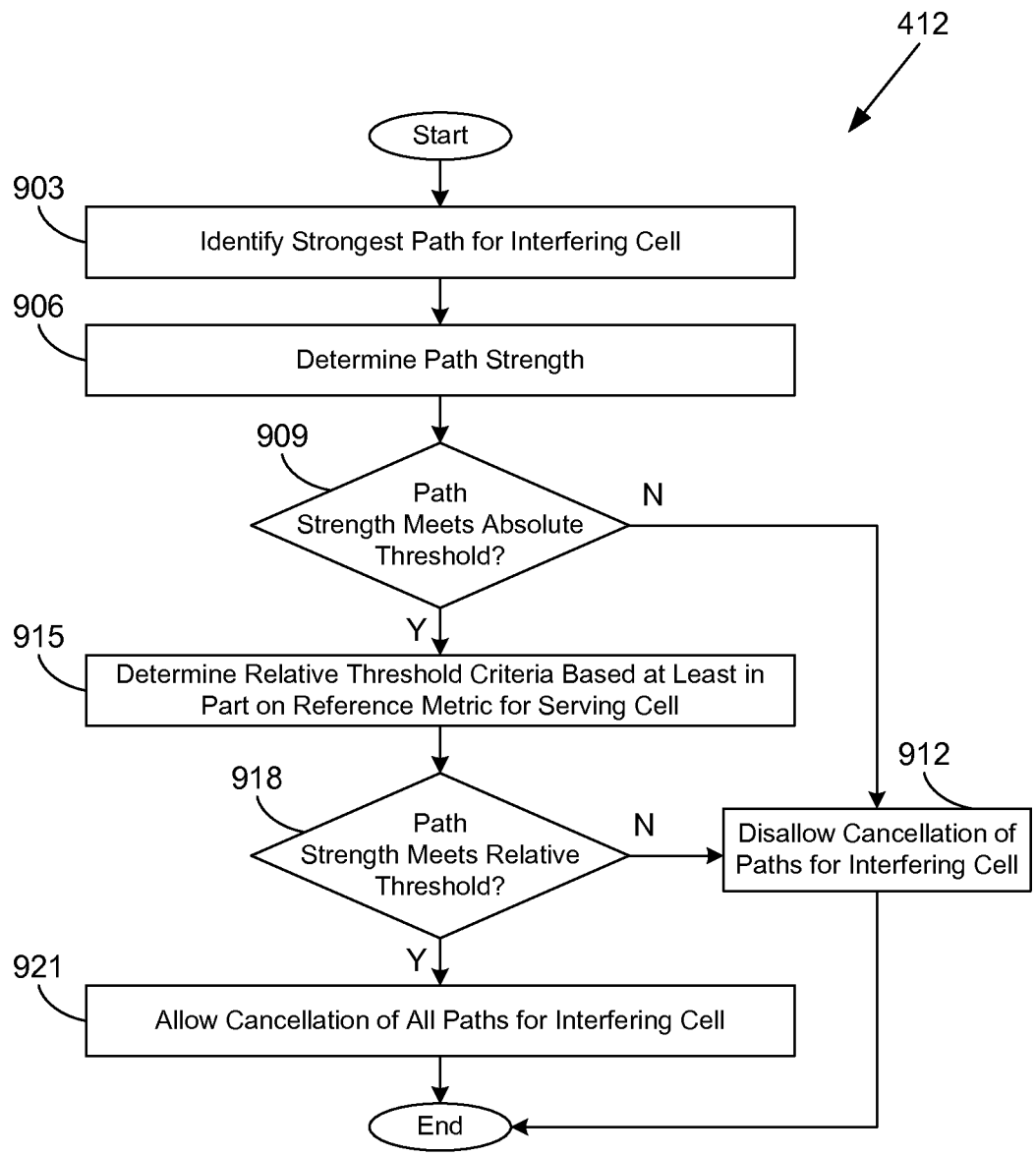

With reference to FIG. 9, shown is a flowchart that provides one example of the operation of a portion of the path admission logic 303 (FIG. 3) according to a fifth embodiment. In particular, FIG. 9 relates to box 412 of FIG. 4, which involves detecting true interfering paths which are too weak for cancellation. FIG. 9 relates to another form of per-cell cancellation, where cancellation is enabled on a per-cell basis. It is understood that the flowchart of FIG. 9 provides merely an example of the many different types of functional arrangements that may be employed to implement the operation of the portion of the path admission logic 303 as described herein. As an alternative, the flowchart of FIG. 9 may be viewed as depicting an example of steps of a method implemented in the path admission logic 303 according to a fifth embodiment.

Beginning with box 903, the path admission logic 303 identifies the strongest path for an interfering cell. In box 906, the path admission logic 303 determines the path signal strength (e.g., for CPICH in Ec/Io or some other measure). In box 909, the path admission logic 303 determines whether the path strength meets some absolute threshold (e.g., the CPICH Ec/Io is at least Y dB, where Y is a threshold value). If the path strength does not meet the absolute threshold criteria, the path admission logic 303 moves to box 912 and disallows cancellation of all paths associated with the interfering cell. Thereafter, the portion of the path admission logic 303 ends.

If the path strength does meet the absolute threshold criteria, the path admission logic 303 moves from box 909 to box 915 and determines relative threshold criteria based at least in part on a reference signal strength metric for the serving cell. The reference signal strength metric may correspond, for example, to the signal strength (e.g., in Ec/Io or some other measure) for the strongest path of the serving cell (i.e., the desired signal), the total sum of signal strengths for all paths of the serving cell, the sum of signal strengths for a subset of strongest paths for the serving cell, and so on. In box 918, the path admission logic 303 determines whether the path strength for the current finger meets relative threshold criteria. For example, the relative threshold criteria may be that the path Ec/Io is within X dB of the Ec/Io of the strongest path of the serving cell, where X is a threshold value. X may be selected such that X is much larger than Y. As a non-limiting example, X may be −7 dB, and Y may be −20 dB.

If the path strength does not meet the relative threshold criteria, the path admission logic 303 moves to box 912 and disallows cancellation of all of the paths associated with the interfering cell. Thereafter, the portion of the path admission logic 303 ends. If the path strength does meet the relative threshold criteria, the path admission logic 303 instead moves from box 918 to box 921 and allows cancellation of all of the paths associated with the interfering cell. Thereafter, the portion of the path admission logic 303 ends.

The flowcharts of FIGS. 4-9 show the functionality and operation of an implementation of portions of the path admission logic 303 (FIG. 3). If embodied in software, each block may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a processor 206 (FIG. 2) in a computer system or other system. The machine code may be converted from the source code, etc. If embodied in hardware, each block may represent a circuit or a number of interconnected circuits to implement the specified logical function(s).

Although the flowcharts of FIGS. 4-9 show a specific order of execution, it is understood that the order of execution may differ from that which is depicted. For example, the order of execution of two or more blocks may be scrambled relative to the order shown. Also, two or more blocks shown in succession in FIGS. 4-9 may be executed concurrently or with partial concurrence. Further, in some embodiments, one or more of the blocks shown in FIGS. 4-9 may be skipped or omitted. In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present disclosure.

Also, any logic or application described herein that comprises software or code can be embodied in any non-transitory computer-readable medium for use by or in connection with an instruction execution system such as, for example, a processor 206 in a computer system or other system. In this sense, the logic may comprise, for example, statements including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system.

The computer-readable medium can comprise any one of many physical media such as, for example, magnetic, optical, or semiconductor media. More specific examples of a suitable computer-readable medium would include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

The invention claimed is:

1. A system for signal processing, comprising:
    at least one circuit or processor for use in a wireless communication device, wherein the at least one circuit or processor is configured to:
        obtain at least one signal strength metric for each of a plurality of signal paths;
        determine whether a signal path among the plurality of signal paths is selected as a cancellation candidate in response to determining that the signal path is a strong interfering path based at least in part on the at least one signal strength metric for the signal path and first threshold criteria;
        refrain from selecting the signal path as the cancellation candidate in response to determining that the signal path is a weak interfering path based at least in part on the at least one signal strength metric for the signal path and second threshold criteria; and
        enable cancellation of an estimated signal generated using the signal path in response to the signal path being selected as the cancellation candidate.

2. The system of claim 1, wherein the at least one signal strength metric is obtained from a rake receiver, an equalizer, or a cluster path processor.

3. The system of claim 1, wherein the first threshold criteria includes absolute threshold criteria and relative threshold criteria.

4. The system of claim 3, wherein the relative threshold criteria is based at least in part on a reference signal strength metric associated with a serving cell.

5. The system of claim 1, wherein the at least one circuit or processor is further configured to refrain from selecting the signal path as the cancellation candidate in response to determining that the signal path is a false path based at least in part on determining that a plurality of signal strength metrics for the signal path do not meet a true path absolute threshold during a predefined time period.

6. The system of claim 1, wherein the cancellation is enabled on a per-path basis.

7. The system of claim 1, wherein the cancellation is enabled on a per-cell basis.

8. A system for signal processing, comprising:
    means for obtaining at least one signal strength value for each of a plurality of signal paths;
    means for canceling interference from a received signal according to an estimated signal generated from a signal path from among the plurality of signal paths;
    means for selectively enabling the means for canceling interference for the signal path based at least in part on the at least one signal strength value of the signal path and threshold criteria; and
    wherein the at least one signal strength value corresponds to a plurality of signal strength values obtained over a time period, and the threshold criteria indicates that the means for canceling interference is not to be enabled for the signal path when none of the signal strength values for the signal path meets a minimum threshold for being a true interfering path.

9. The system of claim 8, wherein the means for selectively enabling the means for canceling interference is configured to selectively enable the means for canceling interference on a per-interfering-cell basis or a per-signal-path basis.

10. The system of claim 8, wherein the means for selectively enabling the means for canceling interference is configured to place the means for canceling interference in a bypass mode when the means for canceling interference has not been enabled for any of the plurality of signal paths.

11. A method for signal processing, comprising:
    obtaining at least one signal strength value for each of a plurality of signal paths; and
    for each signal path from among the plurality of signal paths:
        configuring an interference cancellation module to refrain from canceling the signal path from a received signal in response to determining that the signal path is a false path based at least in part on the at least one signal strength value for the signal path and first absolute threshold criteria; and wherein the at least one signal strength value corresponds to a plurality of signal strength values obtained over a time period, and the first absolute threshold criteria indicates that the signal path is the false path when none of the signal strength values meets a minimum threshold for being a true interfering path.

12. The method of claim 11, further comprising disabling the interference cancellation module in response to the configuring the interference cancellation module to refrain from canceling all of the plurality of signal paths.

13. The method of claim 11, further comprising configuring the interference cancellation module to refrain from canceling the signal path from the received signal in response to determining that the signal path is a weak interfering path based at least in part on the at least one signal strength value for the signal path and second absolute threshold criteria.

14. The method of claim 11, further comprising:
for each signal path from among the plurality of signal paths:
when the signal path is determined to be a strongest one of at least one of the plurality of signal paths that are associated with an interfering cell, configuring the interference cancellation module to refrain from canceling any of the at least one of the plurality of signal paths that are associated with the interfering cell from the received signal in response to determining that the signal path is a weak interfering path, the signal path being determined as the weak interfering path based at least in part on the at least one signal strength value for the signal path, second absolute threshold criteria, and first relative threshold criteria.

15. A method for signal processing, comprising:
obtaining at least one signal strength value for each of a plurality of signal paths; and
for each signal path from among the plurality of signal paths:
configuring an interference cancellation module to refrain from canceling the signal path from a received signal in response to determining that the signal path is a false path based at least in part on the at least one signal strength value for the signal path and first absolute threshold criteria; and
configuring the interference cancellation module to refrain from canceling the signal path from the received signal in response to determining that the signal path is a weak interfering path based at least in part on the at least one signal strength value for the signal path, second absolute threshold criteria, and first relative threshold criteria.

16. The method of claim 15, wherein the second absolute threshold criteria indicates that the signal path is the weak interfering path when the at least one signal strength value for the signal path does not meet a minimum absolute threshold.

17. The method of claim 15, wherein the first relative threshold criteria indicates that the signal path is a weak interfering path when the at least one signal strength value for the signal path does not meet a minimum threshold relative to a reference signal strength metric associated with a serving cell.

18. The method of claim 15,
wherein the interference cancellation module is configured to refrain from canceling the signal path from the received signal in response to determining that the signal path is the weak interfering path and in response to determining that the signal path is a strongest one of the at least one of the plurality of signal paths that are associated with an interfering cell.

19. The method of claim 18, further comprising:
when the one of the signal paths is determined to be the strongest one of the at least one of the plurality of signal paths that are associated with the interfering cell and the signal path is determined not to be the weak interfering path, configuring the interference cancellation module to refrain from canceling another one of the at least one of the plurality of signal paths that are associated with the interfering cell from the received signal in response to determining that the other one of the at least one of the plurality of signal paths is the weak interfering path, the other one of the at least one of the plurality of signal paths being determined as the weak interfering path based at least in part on at least one signal strength value for the other one of the at least one of the plurality of signal paths, third absolute threshold criteria, and second relative threshold criteria.

20. The method of claim 15,
wherein the signal path is determined to be the weak interfering path based at least in part on a sum of the signal strength values of a subset of a set of the plurality of signal paths which are associated with an interfering cell.

* * * * *